(12) United States Patent
Cao

(10) Patent No.: US 11,245,042 B2
(45) Date of Patent: Feb. 8, 2022

(54) THIN FILM TRANSISTOR, FABRICATING METHOD THEREOF, DISPLAY SUBSTRATE AND DISPLAY APPARATUS

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventor: Binbin Cao, Beijing (CN)

(73) Assignees: HEFEI XINSHENG OPTOELECTRONICS TECHNOLOGY CO., LTD, Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/770,252

(22) PCT Filed: Nov. 7, 2019

(86) PCT No.: PCT/CN2019/116180
§ 371 (c)(1),
(2) Date: Jun. 5, 2020

(87) PCT Pub. No.: WO2020/134625
PCT Pub. Date: Jul. 2, 2020

(65) Prior Publication Data
US 2021/0249541 A1 Aug. 12, 2021

(30) Foreign Application Priority Data
Dec. 25, 2018 (CN) .......................... 201811588559.5

(51) Int. Cl.
H01L 29/786 (2006.01)
H01L 29/66 (2006.01)

(52) U.S. Cl.
CPC .. *H01L 29/78696* (2013.01); *H01L 29/66969* (2013.01); *H01L 29/78603* (2013.01);
(Continued)

(58) Field of Classification Search
CPC ......... H01L 29/78696; H01L 29/66969; H01L 29/78603; H01L 29/78618; H01L 29/78693; H01L 29/78633
(Continued)

(56) References Cited

U.S. PATENT DOCUMENTS 6,297,862 B1 * 10/2001 Murade ............. G02F 1/136209
349/44
2003/0164500 A1 * 9/2003 Tsunoda ............. H01L 29/78636
257/72
(Continued)

FOREIGN PATENT DOCUMENTS

| CN | 104681627 A | 6/2015 |
|----|-------------|--------|
| CN | 105097948 A | 11/2015 |
| CN | 107331619 A | 11/2017 |
| CN | 109860305 A | 6/2019 |

OTHER PUBLICATIONS

Office Action dated Apr. 13, 2020, issued in counterpart CN Application No. 201811588559.5, with English Translation. (12 pages).
(Continued)

Primary Examiner — Tong-Ho Kim
(74) Attorney, Agent, or Firm — Westerman, Hattori, Daniels & Adrian, LLP

(57) ABSTRACT

A thin film transistor (10) may include a substrate (100); a buffer layer (300) on a surface of the substrate (100); an active layer (400) on a surface of the buffer layer (300) opposite from the substrate (100); a gate insulating layer (500) on a surface of the active layer (400) opposite from the substrate (100), and a gate (600) on a surface of the gate
(Continued)

insulating layer (500) opposite from the substrate (100). A width of the active layer (400) may be smaller than a width of the gate (600), and an orthographic projection of the gate (600) on the substrate (100) may cover an orthographic projection of the active layer (400) on the substrate (100).

13 Claims, 14 Drawing Sheets

(52) U.S. Cl.
CPC .. *H01L 29/78618* (2013.01); *H01L 29/78693* (2013.01); *H01L 29/78633* (2013.01)

(58) Field of Classification Search
USPC .......................................................... 257/43
See application file for complete search history.

(56) References Cited

U.S. PATENT DOCUMENTS

| | | | |
|---|---|---|---|
| 2005/0139918 A1* | 6/2005 | Lee ........................ | H01L 27/127 |
| | | | 257/347 |
| 2009/0230397 A1 | 9/2009 | Noda et al. | |
| 2018/0254328 A1* | 9/2018 | Wang ................... | H01L 29/7869 |
| 2019/0006490 A1 | 1/2019 | Xu et al. | |

OTHER PUBLICATIONS

International Search Report dated Feb. 11, 2020, issued in counterpart Application No. PCT/CN2019/116180.

\* cited by examiner

Related Art

THIN FILM TRANSISTOR, FABRICATING METHOD THEREOF, DISPLAY SUBSTRATE AND DISPLAY APPARATUS

CROSS-REFERENCE TO RELATED APPLICATIONS

This application claims benefit of the filing date of Chinese Patent Application No. 201811588559.5 filed on Dec. 25, 2018, the disclosure of which is hereby incorporated in its entirety by reference.

TECHNICAL FIELD

The present disclosure relates to display technologies, and in particular, to a thin film transistor, a method for fabricating the same, a display substrate, and a display apparatus.

BACKGROUND

The present display panels include liquid crystal display (LCD) panels and organic light-emitting diode display (OLED) panels. Thin film transistors (TFTs) are core components in a display panel and are arranged in an array in the display panel as switch devices of pixel units of the display panel. In a conventional thin film transistor, the width of the active layer is equal to the width of the gate. Because the width of the active layer is relatively long, the thin film transistor has a small on-state current. To reduce the width of the gate directly, however, is more likely to lead to disconnections.

BRIEF SUMMARY

One embodiment of the present disclosure is a thin film transistor. The thin film transistor may include a substrate; a buffer layer on a surface of the substrate; an active layer on a surface of the buffer layer opposite from the substrate; a gate insulating layer on a surface of the active layer opposite from the substrate, and a gate on a surface of the gate insulating layer opposite from the substrate; wherein a width of the active layer may be smaller than a width of the gate, and an orthographic projection of the gate on the substrate covers an orthographic projection of the active layer on the substrate.

Optionally, a conducting layer may be provided at two sides of the active layer respectively and an orthographic projection of the conducting layer on the substrate partially overlaps the orthographic projection of the gate on the substrate.

Optionally, the buffer layer may include: a first sub-buffer layer on the substrate, and a material forming the first sub-buffer layer contains carriers; and a second sub-buffer layer on a surface of the first sub-buffer layer opposite from the substrate, the second sub-buffer layer comprising at least a thin region, wherein the orthographic projection of the conducting layer covers an orthographic projection of the thin region on the substrate, and the orthographic projection of the thin region at least has an overlapping area with the orthographic projection of the gate on the substrate.

Optionally, a groove may be provided on a surface of the second sub-buffer layer opposite from the first sub-buffer layer, and a part of the second sub-buffer layer under a bottom of the groove constitutes the thin region.

Optionally, a groove may be provided on a surface of the second sub-buffer layer facing the first sub-buffer layer, and a part of the second sub-buffer layer on a top of the groove constitutes the thin region.

Optionally, a thickness of the thin region may be less than or equal to about 100 nm.

Optionally, a material forming the first sub-buffer layer may include silicon nitride.

Optionally, a material forming the second sub-buffer layer may include silicon dioxide.

Optionally, a material forming the active layer may include amorphous indium gallium zinc oxide.

Optionally, a width of the active layer may be within a range of about 1 μm to about 3 μm.

Optionally, the thin film transistor may further include a light shielding layer between the substrate and the buffer layer, wherein an orthographic projection of the light shielding layer on the substrate covers the orthographic projection of the active layer on the substrate, and an area of the orthographic projection of the light shielding layer on the substrate is smaller than an area of the orthographic projection of the gate on the substrate.

Another embodiment of the present disclosure is a method of fabricating a thin film transistor. The method may include: providing a substrate; forming a buffer layer on a surface of the substrate; forming an active layer on a surface of the buffer layer opposite from the substrate; and forming a gate insulating layer and a gate sequentially on a surface of the active layer opposite from the substrate, wherein a width of the active layer is smaller than a width of the gate, and an orthographic projection of the gate on the substrate covers an orthographic of the active layer on the substrate.

Optionally, forming the buffer layer on the surface of the substrate may include: forming a first sub-buffer layer on the surface of the substrate, wherein a material forming the first sub-buffer layer contains carriers; and forming a second sub-buffer layer having at least a thin region on a surface of the first sub-buffer opposite from the substrate.

Optionally, forming the active layer on the surface of the buffer layer opposite from substrate and forming the gate insulating layer and the gate may include: forming a semiconductor layer on a surface of the second sub-buffer layer opposite from the substrate; annealing the semiconductor layer to enable the carriers in the first sub-buffer layer to enter the semiconductor layer through the thin region of the second sub-buffer layer; forming an insulating layer and a metal layer on surfaces of the second sub-buffer layer and the semiconductor layer opposite from the substrate; patterning the metal layer and the insulating layer by one-time patterning process to form the gate and the gate insulating layer respectively; and performing a conducting treatment to a part of the semiconductor layer that is not covered by the gate insulating layer and the gate, thereby obtaining the active layer and the conducting layer.

Optionally, forming the second sub-buffer layer having at least a thin region may include forming the second sub-buffer layer on a surface of the first sub-buffer opposite from the substrate; and forming a groove on a surface of the second sub-buffer layer opposite from the substrate, wherein a part of the second sub-buffer layer under a bottom of the groove constitutes the thin region.

Optionally, forming the second sub-buffer layer having the thin region may include: forming the second sub-buffer layer on a surface of the first sub-buffer opposite from the substrate; and forming a groove on a surface of the second sub-buffer layer facing the substrate, wherein a part of the second sub-buffer layer on a top of the groove constitutes the thin region.

Optionally, the method, before forming the buffer layer on the surface of the substrate, may further include: forming a light shielding layer on the surface of the substrate, wherein an orthographic projection of the light shielding layer on the substrate covers an orthographic projection of the active layer on the substrate, and an area of the orthographic projection of the light shielding layer on the substrate is less than an area of the orthographic projection of the gate on the substrate.

Another embodiment of the present disclosure is a display substrate. The display substrate may include the thin film transistor.

Another embodiment of the present disclosure is a display apparatus. The display apparatus may include the display substrate.

BRIEF DESCRIPTION OF THE DRAWINGS

In order to more clearly illustrate the technical solutions of the embodiments of the present disclosure, the drawings of the embodiments will be briefly described below. It is obvious that the drawings in the following description relate only to some embodiments of the present disclosure, and are not to limit the disclosure.

DETAILED DESCRIPTION

In order to make the objects, technical solutions and advantages of the embodiments of the present disclosure clearer, the technical solutions of the embodiments of the present disclosure will be clearly and completely described below in conjunction with the drawings of the embodiments of the present disclosure. It is apparent that the described embodiments are part of the embodiments of the present disclosure, and not all of the embodiments. All other embodiments obtained by a person of ordinary skill in the art based on the described embodiments of the present disclosure without departing from the scope of the disclosure are within the scope of the disclosure.

Unless otherwise defined, the technical terms or scientific terms used herein should be understood in the ordinary sense as understood by those of ordinary skill in the art to which the disclosure pertains. The words "first," "second," and similar terms used in the present disclosure do not denote any order, quantity, or importance, but are used to distinguish different components. Similarly, "including" or "comprising" and the like means that the element or object appear in front of the word cover the elements or objects and their equivalents listed after the word, and the other elements or objects are not excluded.

A numerical value modified by "about" herein means that the numeric value can vary by 10% thereof.

Figure 1:
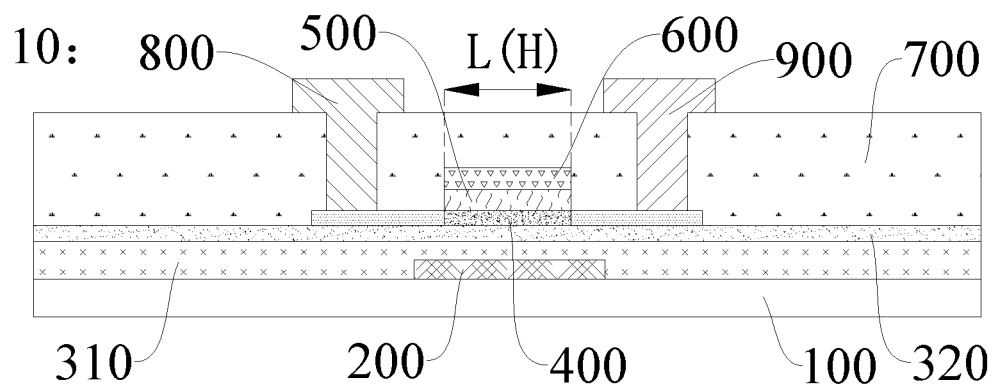
FIG. 1 shows a schematic cross-sectional view of a conventional thin film transistor in the related art.

In the related art, referring to FIG. 1, a thin film transistor 10 includes a light shielding layer 200, a buffer layer, an active layer 400, a gate insulating layer 500, a gate 600, an interlayer insulating layer 700, a source 800, and a drain 900, which are sequentially formed on a substrate 100. The buffer layer is disposed on a side of the light shielding layer 200 opposite from the substrate 100, and the buffer layer includes a first sub-buffer layer 310 and a second sub-buffer layer 320. A conducting treatment is performed on two sides of the active layer 400 after formation of the gate 600 and the gate insulating layer 500. As such, the width L of the active layer is equal to the width H of the gate 600. The thin film transistor 10 thus fabricated has a long width L of the active layer, so that the on-state current is small. To reduce the width of the gate 500 directly is more likely to cause disconnections.

One embodiment of the present disclosure provides a thin film transistor. In one embodiment, referring to FIG. 2, the thin film transistor 10 includes a substrate 100, a buffer layer 300 on the substrate 100, an active layer 400 on a surface of the buffer layer 300 opposite from the substrate, a gate insulating layer 500 on a surface of the active layer 400 opposite from the substrate, and a gate 600 on a surface of the gate insulating layer 500 opposite from the substrate. The orthographic projection of the gate 600 on the substrate 100 overlaps with the orthographic projection of the gate insulating layer 500 on the substrate 100. The width L of the active layer 400 of the thin film transistor 10 is smaller than the width H of the gate 600, and the orthographic projection of the gate 600 on the substrate 100 covers the orthographic projection of the active layer 400 on the substrate 100. Thus, the width L of the active layer 400 of the thin film transistor 10 is not limited by the width H of the gate 600, so that the width of the active layer 400 can be made relatively small. As such, the on-state current of the thin film transistor 10 can be significantly increased. Furthermore, the process is simple, easy to implement, and easy for industrial production.

Figure 2:
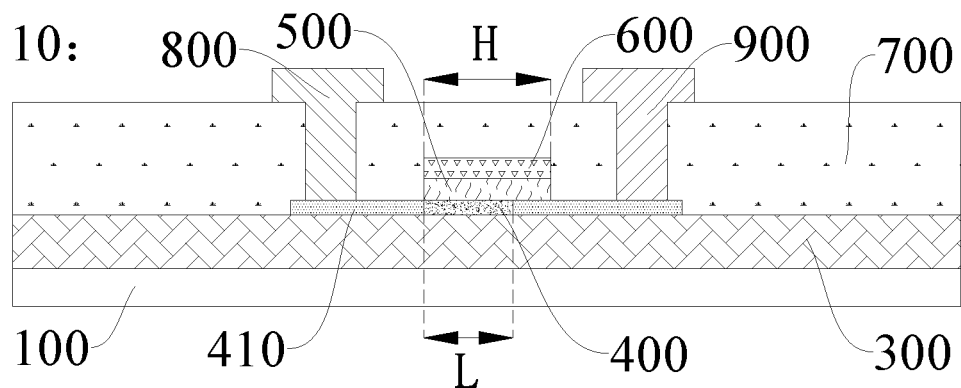
FIG. 2 shows a schematic cross-sectional view of a thin film transistor according to one embodiment of the present disclosure.
Figure 3:
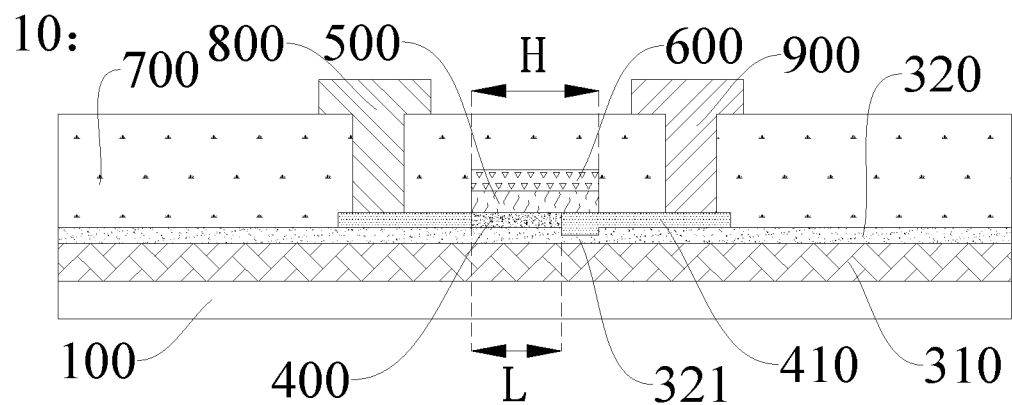
FIG. 3 shows a schematic cross-sectional view of a thin film transistor according to one embodiment of the present disclosure.

According to one embodiment of the present disclosure, it should be understood for those skilled in the art as referring to the FIG. 2 that the thin film transistor further includes an interlayer insulating layer 700, a source 800, and a drain 900. The positional relationships between the interlayer insulating layer 700, the source 800, the drain 900 and other structures are the same or similar as the positional relationships between the interlayer insulating layer, the source, the drain and other structures in the conventional thin film transistor, and are not repeated herein. It should be understood by those skilled in the art that the "width of the active layer" herein has the same meaning as the "channel length" generally referred to in the field of semiconductors, that is, the distance that the current flows along the active layer between the source and the drain after the thin film transistor is turned on. The width of the gate or other structure is defined as the length of the gate or the other structures measured at the same direction as the width of the active layer, that is, the direction the current flows along the active layer between the source and the drain.

In one embodiment, referring to FIG. 2, the thin film transistor 10 is provided with a conducting layer 410 at both sides of the active layer 400. The orthographic projection of the conducting layer 410 overlaps the orthographic projection of the gate on the substrate 100. Therefore, the width L of the active layer 400 of the thin film transistor 10 is not limited by the width H of the gate 600, so that the width of the active layer 400 can be made relatively small, and the on-state current can be significantly increased in the thin film transistor 10. Furthermore, the process is simple, easy to implement, and easy for industrial production.

According to one embodiment of the present disclosure, the material forming the active layer 400 may be made of amorphous indium gallium zinc oxide. As a result, the material is widely available and easy to obtain, low in cost, and easy to implement in the manufacturing process.

In one embodiment, the width of the active layer 400 may be about 1 μm to about 3 μm. In some embodiments, the width of the active layer 400 may be 1 μm, 2 μm or 3 μm. The width of the active layer 400 can be made small as long as that this may not cause the disconnection of the gate, so that the on-state current can be significantly increased in the thin film transistor 10.

In one embodiment, referring to FIGS. 3-6, the buffer layer 300 further includes a first sub-buffer layer 310 on a surface of the substrate 100, and a second sub-buffer layer 320 on a surface of the first sub-buffer layer 310 opposite from the substrate 100. The material forming the first sub-buffer layer 310 contains carriers. The material forming the first sub-buffer layer 310 may be silicon nitride ($SiN_x$) and the material forming the second sub-buffer layer 320 may be silicon dioxide ($SiO_2$) Thus, those materials are widely available, easy to obtain and have low cost.

According to some embodiments of the present disclosure, referring to FIGS. 3-6, the second sub-buffer layer 320 includes a thin region 321. The orthographic projection of the conducting layer 410 on the substrate 100 covers the orthographic projection of the thin region 321 on the substrate 100. The orthographic projection of the thin region 321 on the substrate 100 at least partially overlaps with the orthographic projection of the gate 600 on the substrate 100. Therefore, the width L of the active layer 400 of the thin film transistor 10 is not limited by the width H of the gate 600. Optionally, the implementation is described as follows.

In one embodiment, the active layer 400 and the conducting layer 410 are obtained by first forming a semiconductor layer on the entire surface of the second sub-buffer layer 320, and then by performing a conducting treatment to parts of the semiconductor layer.

In one embodiment, the material forming the second sub-buffer layer 320 may be made of silicon dioxide and the material forming the first sub-buffer layer 310 may be made of silicon nitride. The silicon nitride material may contain a large number of carriers, for example, hydrogen ions and the like. The second sub-buffer layer 320 of the thin film transistor 10 is provided with a thin region 321. During the fabrication of the thin film transistor 10, a process may be applied so that the carriers in the material forming the second sub-buffer layer 320 can flow into the semiconductor layer through the thin region 321 on the second sub-buffer layer 320, thereby performing a conducting treatment to a part of the semiconductor layer where the carriers enter. Conventional processes such as ion doping can also be applied in the subsequent process to perform a conducting treatment on other part of the semiconductor layer, thereby forming the conducting layer 410 and the active layer 400. Thus, it allows the width L of the active layer 400 not to be limited by the width H of the gate 600 and the width of the active layer 400 can be made smaller. As a result, the on-state current can be significantly increased, and the process is simple, easy to implement, and easy for industrial production.

In one embodiment, the thickness of the thin region 321 in a direction perpendicular to the substrate may be greater than 0 and less than or equal to 100 nm. In some embodiments of the present disclosure, the thickness of the thin region may be 1 nm, 2 nm, 5 nm, 10 nm, 20 nm, 50 nm, 80 nm, or 100 nm. When the thickness of the thin region 321 is in a proper range, the carriers described above may more easily move through the thin region 321 of the second sub-buffer layer 320, and at the same time the carriers are prevented from moving through the second sub-buffer layer 320 in the non-thin regions. Therefore, the thin film transistor can operate normally. Thus, the width L of the active layer 400 of the thin film transistor 10 is not limited by the width H of the gate 600. The width of the active layer 400 can be made relatively small and the on-state current can be significantly increased.

Figure 4:
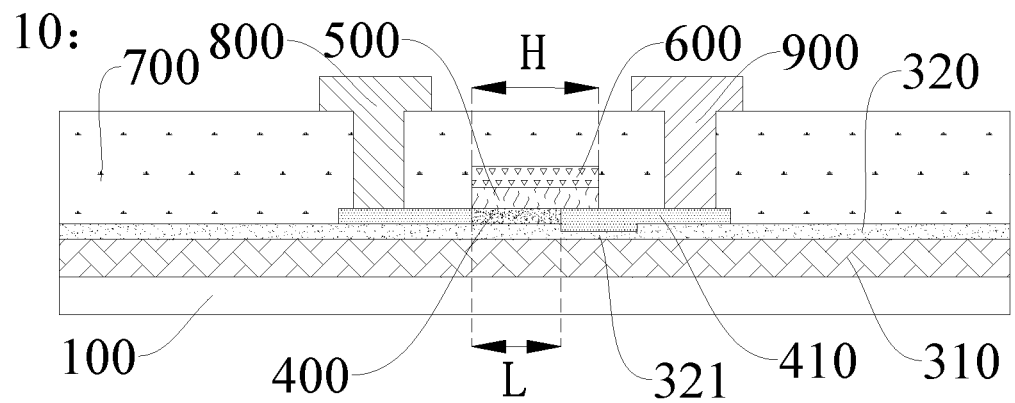
FIG. 4 shows a schematic cross-sectional view of a thin film transistor according to one embodiment of the present disclosure.

In one embodiment, the orthographic projection of the thin region 321 on the substrate 100 may at least partially overlap with the orthographic projection of the gate 600 on the substrate 100. That is, a thin region may also be provided in a part of the second sub-buffer layer 320 whose orthographic projection on the substrate does not overlap with the orthographic projection of the gate 600 on the substrate 100, as shown in FIG. 4. Because the thin region 321 on the second sub-buffer layer 320 extends to a region that does not overlap the orthographic projection of the gate 600 on the substrate 100, the conducting treatment can be applied to a larger region of the semiconductor layer. This would help preventing disconnection of the conducting layer 410 in the subsequent fabrication process, which otherwise may result in the inoperable thin film transistor 10, and allowing the width L of the active layer 400 of the thin film transistor 10 not to be limited by the width H of the gate 600. The width of the active layer 400 can be made relatively small, thereby significantly increasing the on-state current. Furthermore, the process is simple, easy to implement, and easy for industrial production.

Figure 5:
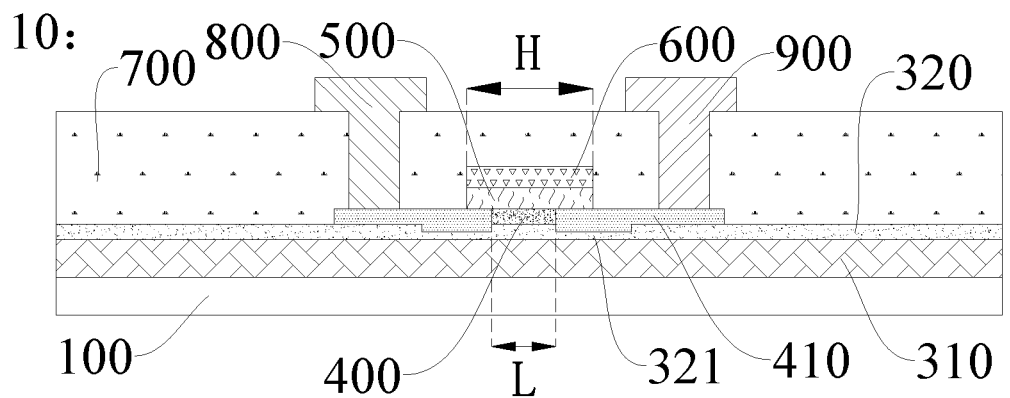
FIG. 5 shows a schematic cross-sectional view of a thin film transistor according to one embodiment of the present disclosure.
Figure 6:
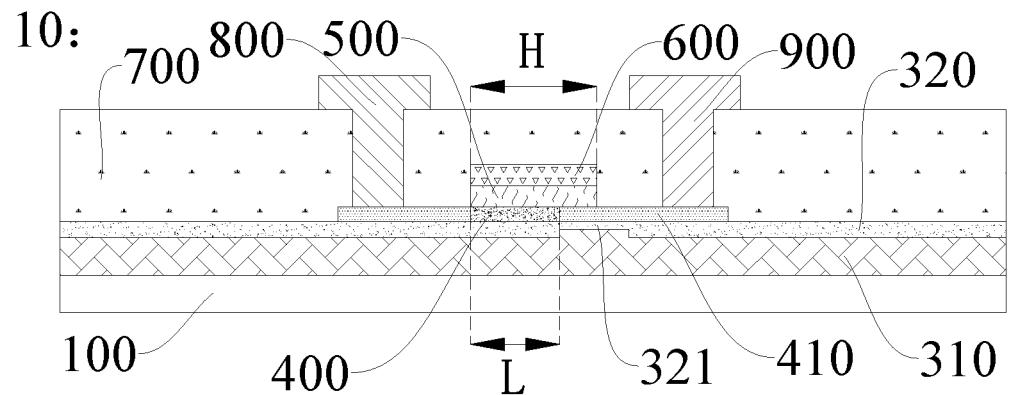
FIG. 6 shows a schematic cross-sectional view of a thin film transistor according to one embodiment of the present disclosure.

In one embodiment, a plurality of thin regions 321 may be provided. For example, the second sub-buffer layer 320 at both sides of the gate 600 may have thin regions 321, as shown in FIG. 5. A plurality of thin regions 321 may further allow the width L of the active layer 400 of the thin film transistor 10 not to be limited by the width H of the gate 600. The width of the active layer 400 can be made smaller, and the on-state current can be further increased.

In one embodiment, there is no particular restriction on the position of the thin region 321. The thin region 321 may be formed by thinning a surface of the second sub-buffer layer 320 opposite from the substrate 100, or by thinning a surface of the second sub-buffer layer 320 facing the substrate 100, or by thinning both surfaces of the second sub-buffer layer 320 opposite from the substrate 100 and facing the substrate 100. In some embodiments of the present disclosure, a groove is formed on a surface of the second sub-buffer layer 320 opposite from the first sub-buffer layer 310, and the thin region 321 is the region under the bottom of the groove of the second sub-buffer 320 with reference to FIGS. 3-5. In one embodiment, a groove may be formed on the surface of the second sub-buffer layer 320 facing the first sub-buffer layer 310, and the thin region 321 is the region on the top of the groove of the second sub-buffer 320 with reference to FIG. 6. Both types of thin regions 321 as mentioned above may further allow the width L of the active layer 400 of the thin film transistor 10 not to be limited by the width H of the gate 600. The width of the active layer 400 can be made smaller, and further less than the width of the gate 600 of the thin film transistor 10. The on-state current is further increased. Compared with the thin region 321 in FIG. 6, the thin region 321 in FIGS. 3-5 may require a process, which is simple, easier to implement and easier for industrial production.

Figure 7:
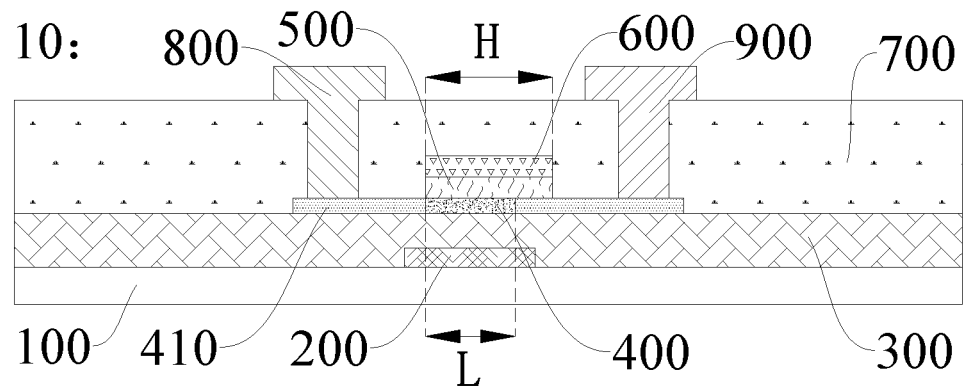
FIG. 7 shows a schematic cross-sectional view of a thin film transistor according to one embodiment of the present disclosure.
Figure 8:
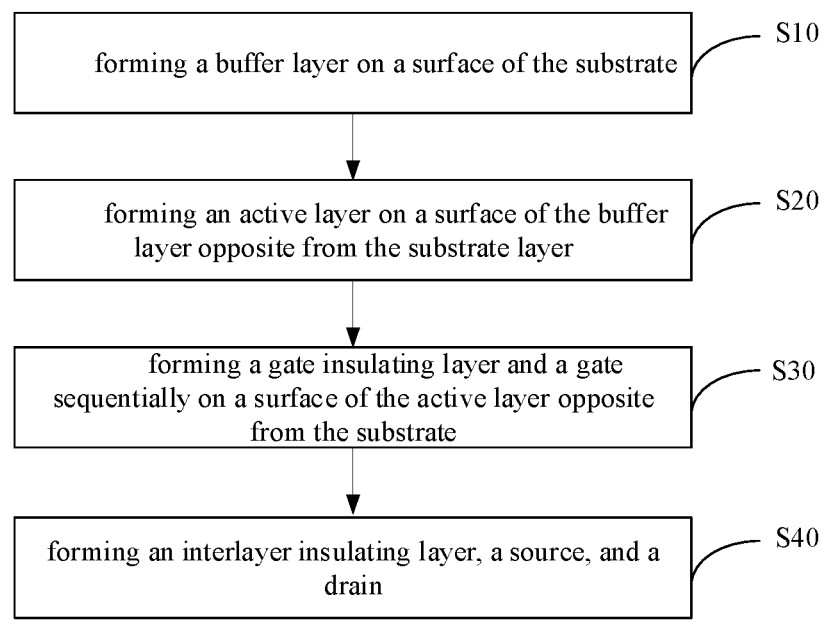
FIG. 8 is a flow chart showing a method of fabricating a thin film transistor according to one embodiment of the present disclosure.

In one embodiment, referring to FIG. 7, the thin film transistor 10 further includes a light shielding layer 200 between the substrate 100 and the buffer layer 300. The orthographic projection of the light shielding layer on the substrate 100 covers the orthographic projection of the active layer 400 on the substrate 100. The area of the orthographic projection of the light-shielding layer 200 on the substrate 100 is less than that of the gate 600 on the substrate 100. Therefore, because the width L of the active layer 400 of the thin film transistor 10 is not limited by the width H of the gate 600, the width of the active layer 400 can be made smaller. The light shielding layer 200 of the thin film transistor 10 may only cover the active layer 400. The area of the orthographic projection of the light shielding layer on the substrate 100 may be less than the area of the orthographic projection of the gate 600 on the substrate 100.

Figure 9A:
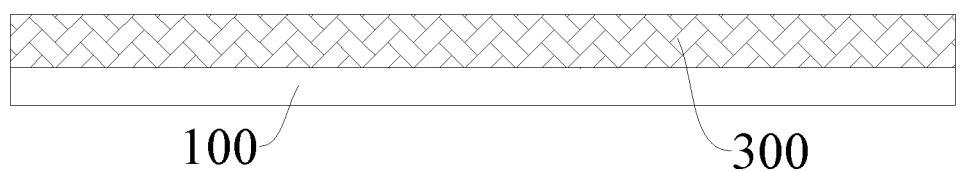
FIGS. 9a-9d show schematic views of a method for fabricating a thin film transistor according to one embodiment of the present disclosure.

Another embodiment of the present disclosure provides a method for making a thin-film transistor. According to one embodiment of the present disclosure, referring to FIGS. 8 and 9a to 9d, the method comprises the following steps:

Step S10 includes forming a buffer layer 300 on a surface of a substrate 100 with reference to FIG. 9a.

In one embodiment, a process for forming the buffer layer 300 on the surface of the substrate 100 may employ vacuum evaporation, chemical vapor deposition, spin coating, or inkjet printing. The process parameters used in vacuum evaporation, chemical vapor deposition, spin coating, or inkjet printing may be conventional process parameters in those processes and are not repeated herein. As such, the fabrication process is simple, easy to implement, and easy for industrial production.

Figure 9B:
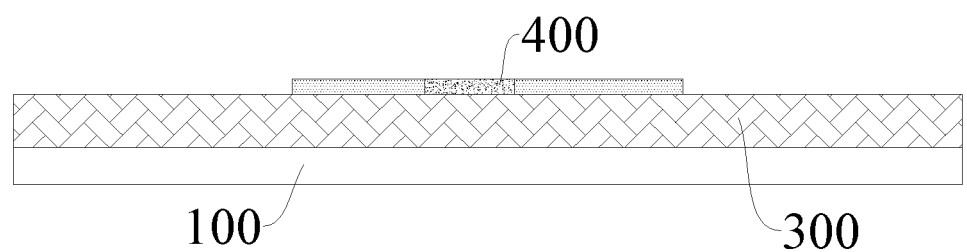

Step S20 includes forming an active layer 400 on a surface of the buffer layer 300 opposite from the substrate 100 with reference to FIG. 9b.

In one embodiment, a process for forming an active layer 400 on the surface of the buffer layer 300 opposite from the substrate 100 may employ vacuum evaporation, chemical vapor deposition, spin coating, and inkjet printing. The conventional process parameters used in vacuum evaporation, chemical vapor deposition, spin coating, and inkjet printing are not repeated herein. As such, the fabrication process is simple, easy to implement, and easy for industrial production.

Figure 9C:
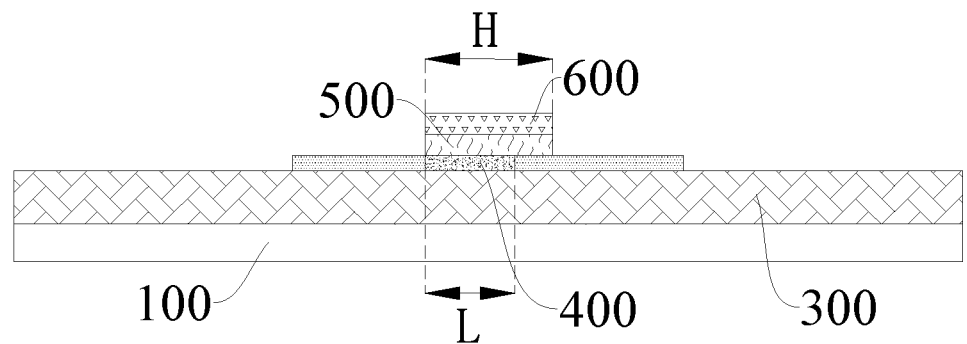

Step S30 includes forming a gate insulating layer 500 and a gate 600 sequentially on a surface of the active layer 400 opposite from the substrate 100. The orthographic projection of the gate 600 on the substrate 100 overlaps with the orthographic projection of the gate insulating layer 500 on the substrate 100 and the width L of the active layer 400 of the thin film transistor 10 is smaller than the width H of the gate. The orthographic projection of the gate 600 on the substrate 100 covers the orthographic projection of the active layer 400 on the substrate 100, as shown in FIG. 9c.

In one embodiment, a process of forming the gate insulating layer 500 on the surface of the active layer 400 opposite from the substrate 100 may employ vacuum evaporation, chemical vapor deposition, spin coating, and inkjet printing. The conventional process parameters used in these techniques are not repeated herein. The fabrication process is simple, easy to implement, and easy for industrial production.

In one embodiment, a process of forming the gate 600 on the substrate may employ vacuum evaporation, chemical vapor deposition, spin coating, and inkjet printing. The conventional process parameters used in these techniques are not repeated herein. The fabrication process is simple, easy to implement, and easy for industrial production.

Figure 9D:
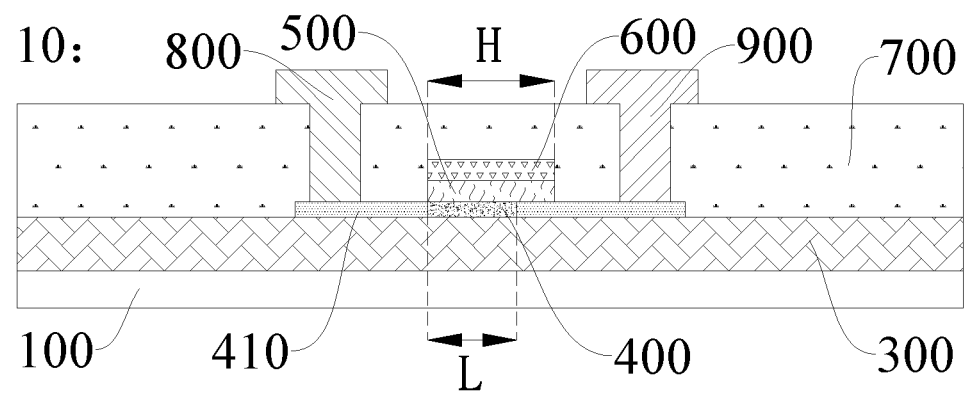
Figure 10:
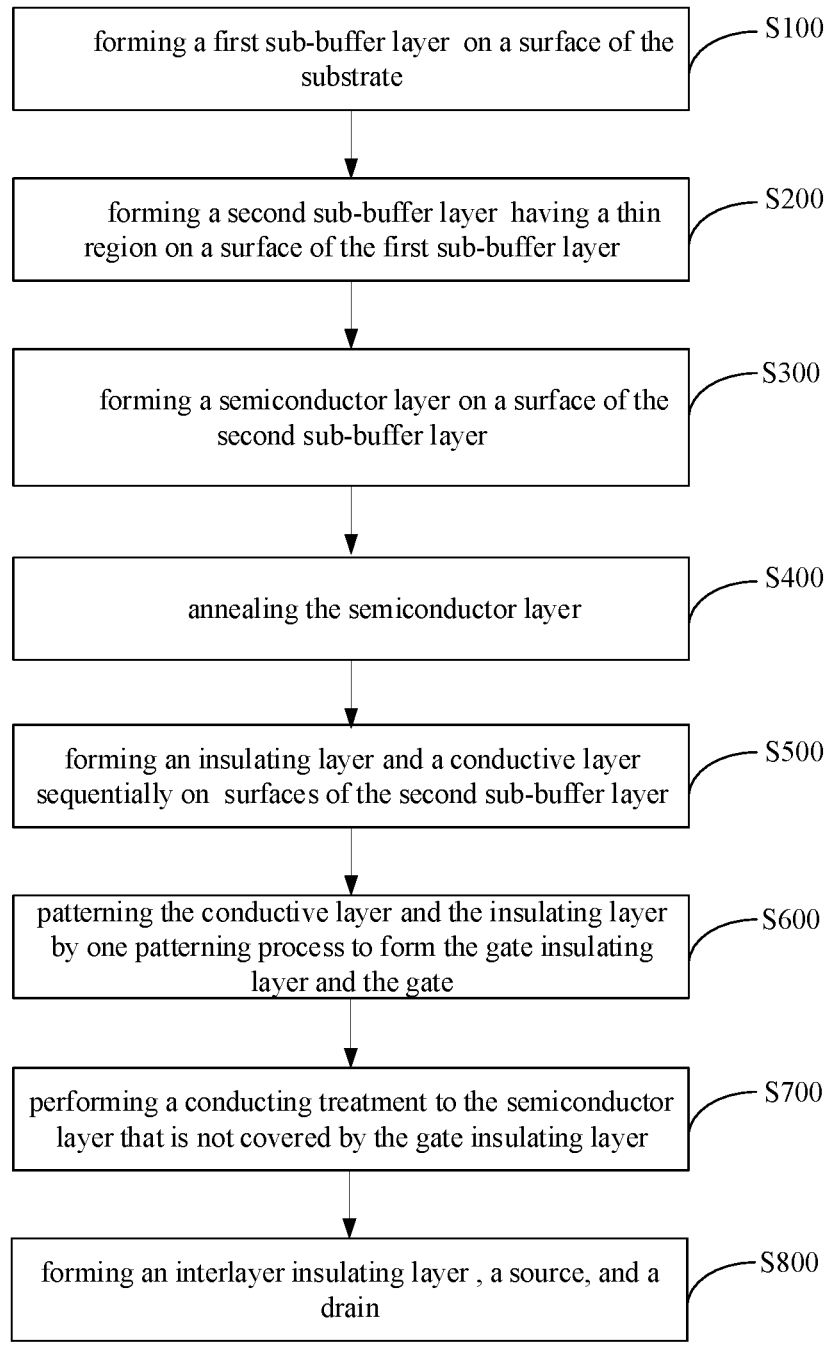
FIG. 10 is a flow chart showing a method for fabricating a thin film transistor according to one embodiment of the present disclosure.

Step S40 includes forming an interlayer insulating layer 700, a source 800, and a drain 900, as shown in FIG. 9d.

In one embodiment, processes for forming the interlayer insulating layer 700, the source 800, and the drain 900 are all conventional. The process parameters are also conventional process parameters, and they are not repeated herein.

Figure 11A:
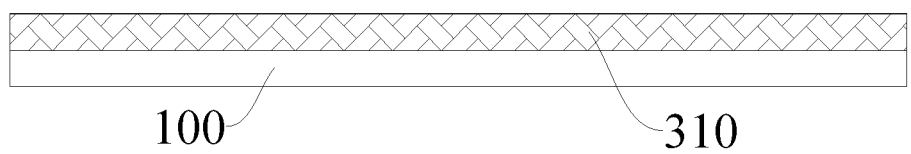
FIGS. 11a-11h show schematic views of a method for fabricating a thin film transistor according to one embodiment of the present disclosure.

In one embodiment, with reference to FIGS. 10 and 11a to 11h, the method further includes the following steps:

With reference to FIG. 11a, step S100 includes forming a first sub-buffer layer 310 on a surface of the substrate 100, wherein the material forming the first sub-buffer layer 310 contains carriers.

In one embodiment, the process of forming the first sub-buffer layer 310 on the surface of the substrate 100 may employ vacuum evaporation, chemical vapor deposition, spin coating, and inkjet printing. The conventional process parameters are used in these techniques, and they are not repeated herein. The fabrication process is simple, easy to implement, and easy for industrial production.

Figure 11B:
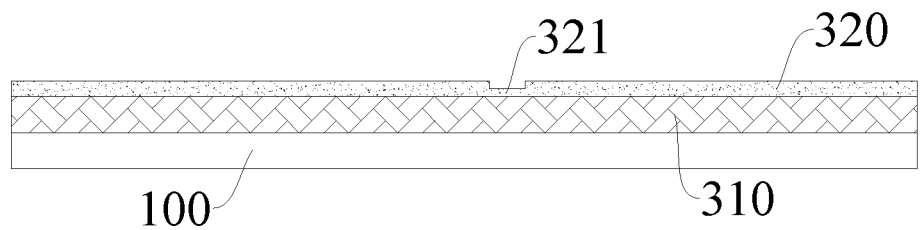

Step S200 includes forming a second sub-buffer layer 320 having a thin region 321 on a surface of the first sub-buffer layer 310 opposite from the substrate 100, as shown in FIG. 11b.

In one embodiment, a process of forming the second sub-buffer layer 320 having the thin region 321 on the surface of the first sub-buffer layer 310 opposite from the substrate 100 may employ vacuum evaporation, chemical vapor deposition, spin coating, and inkjet printing. The conventional process parameters are used in these techniques and they are not repeated herein. The fabrication process is simple, easy to implement, and easy for industrial production.

In some embodiments of the present disclosure, forming the second sub-buffer layer 320 includes forming a second sub-buffer layer 320 on the first sub-buffer layer 310, and forming a groove on a surface of the second sub-buffer layer 320 opposite from the substrate 100, wherein the thin region 321 is the region under the bottom of the groove of the second sub-buffer layer 320. Therefore, the process is simple, easy to implement, and easier for industrial production. The process allows the width L of the active layer 400 of the thin film transistor 10 not to be limited by the width H of the gate 600. The width of the active layer 400 can be made relatively small, thereby further reducing the width of the active layer 400 and thus increasing the on-state current.

Figure 11C:
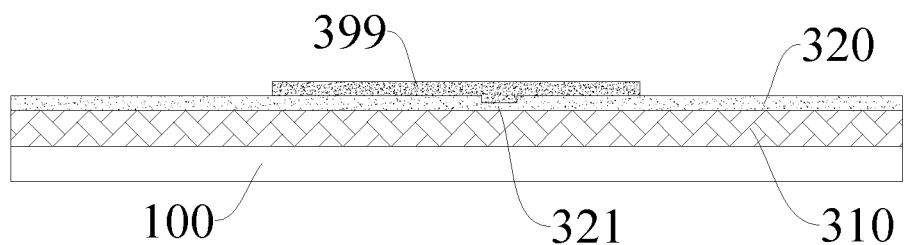

Step S300 includes forming a semiconductor layer 399 on a surface of the second sub-buffer layer 320 opposite from the substrate 100 (see FIG. 11c for a schematic structural view).

In one embodiment, the processes of forming the active layer 400 on a surface of the second sub-buffer layer 320 opposite from the substrate and forming the conducting layer 410 at both sides of the active layer 400 may employ vacuum evaporation, chemical vapor deposition, spin coating, and inkjet printing. The conventional process parameters are used in these techniques, and they are not repeated herein. The conducting layer 410 may be formed by performing a conducting treatment on the semiconductor layer. The conducting treatment may be an annealing process at a high temperature, which makes carriers in the second sub-buffer layer 320 flowing into the semiconductor layer, thereby forming the conducting layer 410. The fabrication process is simple, easy to implement, and easy for industrial production.

Figure 11D:
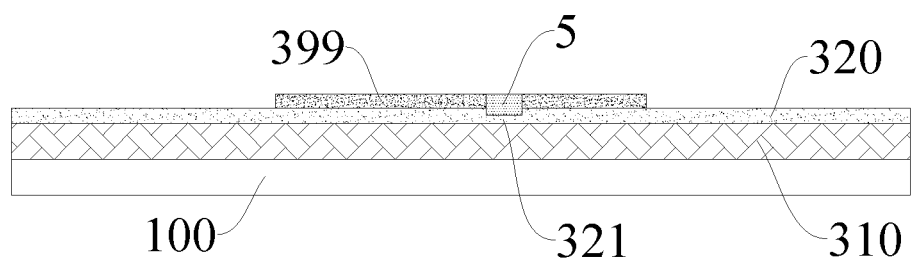

Step S400 includes annealing the semiconductor layer 399 so that the carriers in the first sub-buffer layer 310 enter into the semiconductor layer 399 through the thin region 321 of the second sub-buffer layer 320, as shown in FIG. 11d.

Figure 11E:
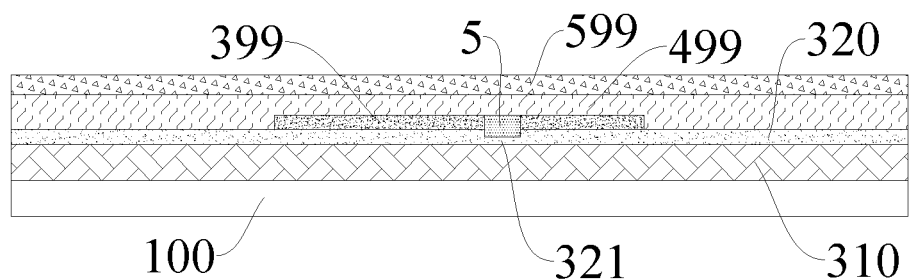
Figure 11F:
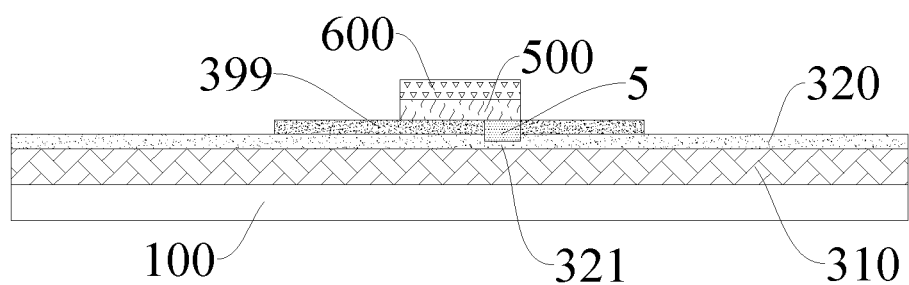

In one embodiment, the annealing treatment is performed at a high temperature such that carriers (e.g., hydrogen ions) in the material forming the first sub-buffer layer 310 enter into the semiconductor layer 399 through the thin region 321 of the second sub-buffer layer 320, thereby making a part of the semiconductor layer 399 to be conductive, which is the structure 5 in FIGS. 11d to 11f. Because the thickness of the thin region 321 is in a certain range, no excessive carriers may enter into the semiconductor layer 399 to make the whole semiconductor layer to be conductive that may affect the performance of the thin film transistor.

In one embodiment, the thin region 321 with the range of the thickness described above may be used to prevent carriers from continuously entering into the semiconductor layer 399 in the subsequent fabrication processes, thereby preventing the whole semiconductor layer 399 from becoming conductive. The temperature of the annealing treatment is generally 360 to 400° C. When the thickness of the thinner region 321 is in the range described above, only at the temperature as previously mentioned can be achieved that the carriers enter into the semiconductor layer 399, thereby preventing the semiconductor layer 399 from becoming overly conductive. Therefore, the width of the active layer of the thin film transistor is not limited by the width of the gate and the width of the active layer can be made relatively small. The on-state current can be significantly increased and also the performance in other aspects is better.

Step S500 includes forming an insulating layer and a conductive layer 599 sequentially on surfaces of the second sub-buffer layer 320 and the semiconductor layer 399 opposite from the substrate 100 with reference to FIG. 11e.

In one embodiment, the process of forming an insulating layer 499 on the surfaces of the semiconductor layer 399 opposite from the substrate 100 may employ vacuum evaporation, chemical vapor deposition, spin coating, and inkjet printing. The process parameters used in these techniques are all conventional, and they are not repeated herein. The fabrication process is simple, easy to implement, and easy for industrial production.

In one embodiment, the process of forming a conductive layer 599 may include vacuum evaporation, chemical vapor deposition, rotary coating, and inkjet printing. The conventional process parameters used in these techniques are all conventional, and they are not repeated herein. The fabrication process is simple, easy to implement, and easy for industrial production.

Step S600 includes patterning the conductive layer 599 and the insulating layer 499 by one patterning process to form the gate insulating layer 500 and the gate 600, as shown in FIG. 11f.

In one embodiment, the patterning process includes coating a layer of photoresist on a surface of the conductive layer 599 opposite from the first sub-buffer layer 310, then followed by exposing, developing, dry etching, photoresist peeling and so on, thereby forming the gate insulating layer 500 and the gate 600. The technical parameters used in each step of the conventional patterning process are not repeated herein. The fabrication process is simple, easy to implement, and easy for industrial production.

Figure 11G:
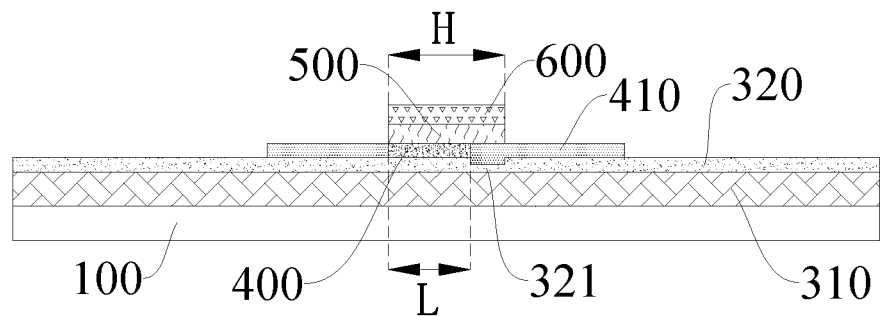

Step S700 includes performing a conducting treatment to the semiconductor layer 399 that is not covered by the gate insulating layer 500 to obtain an active layer 400 and a conducting layer 410, as shown in FIG. 11g.

In one embodiment, a process of performing a conducting treatment to the semiconductor layer 399 that is not covered by the gate insulating layer 500 may be plasma doping or the like. The plasma may be $H_2$ plasma, He plasma, $CF_4$ plasma, $O_2$ plasma, etc. The specific steps, process conditions, and parameters for plasma doping, etc. are all conventional plasma doping steps, process conditions, and parameters, and they are not repeated herein. The process used to achieve the active layer 400 and the conducting layer 410 is simple, easy to implement, and easy for industrial production.

Figure 11H:
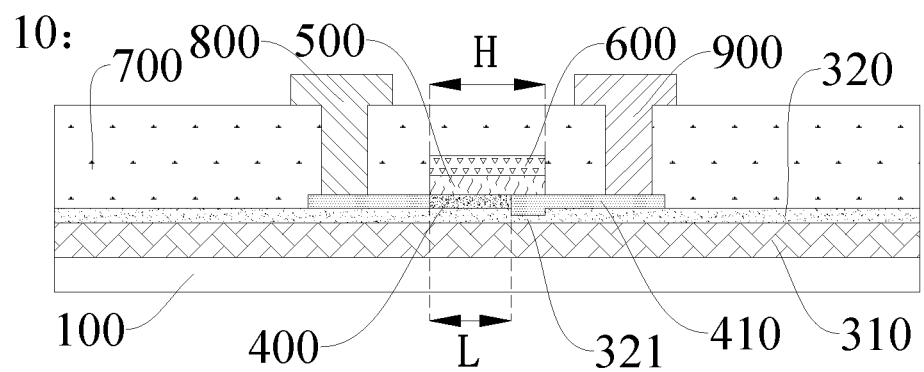

Step S800 includes forming an interlayer insulating layer 700, a source 800, and a drain 900, as shown in FIG. 11h.

In one embodiment, the process conditions, parameters, etc. in the steps of S400, S500, and S600 all are the same or similar to the previous description, and they are not repeated herein.

Figure 12:
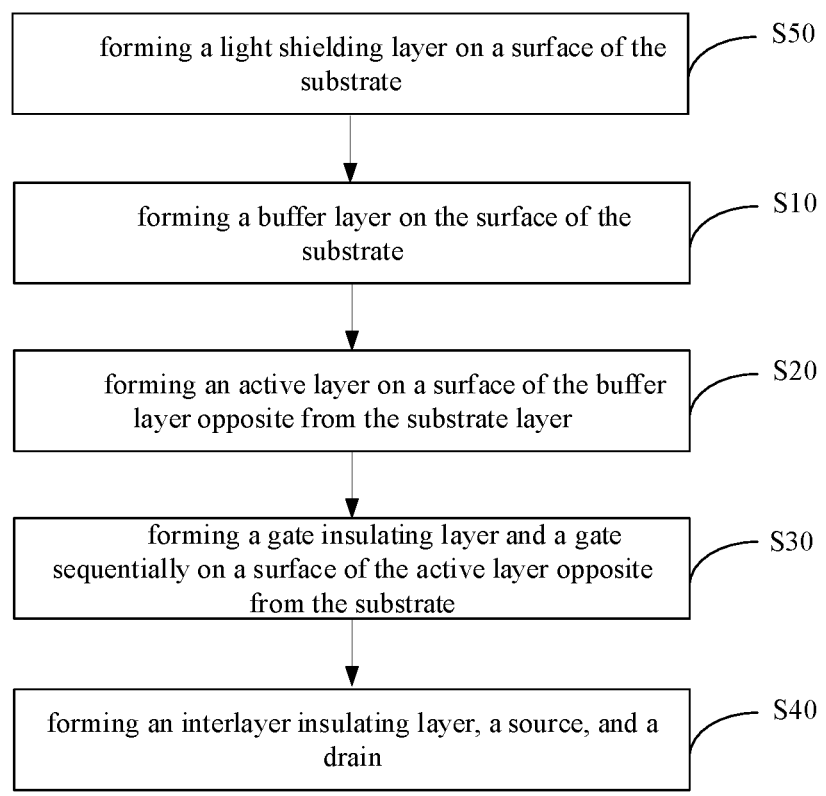
FIG. 12 is a flow chart showing a method for fabricating a thin film transistor according to one embodiment of the present disclosure.
Figure 13A:
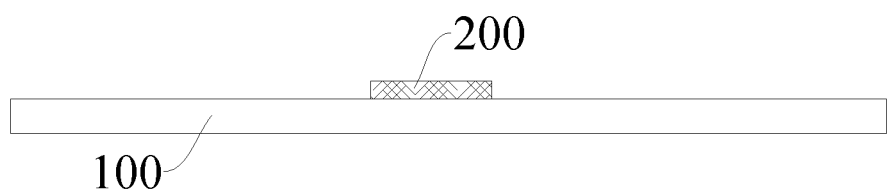
FIGS. 13a and 13b show schematic views of a method for fabricating a thin film transistor according to one embodiment of the present disclosure.
Figure 13B:
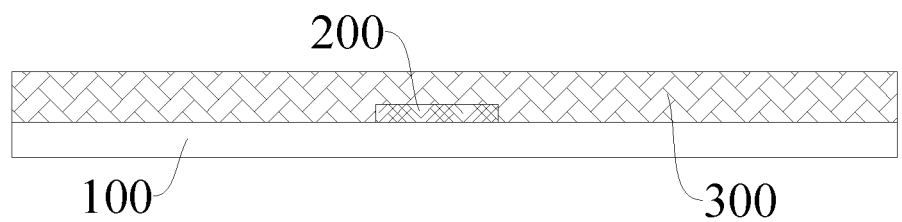

In one embodiment, with reference to FIG. 12 and FIGS. 13a to 13b, before forming the buffer layer 300 on the surface of the substrate 100, the method further includes:

Step S50 includes forming a light shielding layer 200 on the substrate 100 with reference to FIG. 13a.

In one embodiment, an orthographic projection of the light shielding layer 200 on the substrate 100 covers an orthographic projection of the active layer 400 on the substrate 100, and the area of the orthographic projection of the light shielding layer 200 on the substrate is less than the area of the orthographic projection of the gate 600 on the substrate 100.

In one embodiment, the process of forming the light shielding layer 200 on the surface of the substrate 100 may employ vacuum evaporation, chemical vapor deposition, spin coating, and inkjet printing. The conventional process parameters used in these techniques are not repeated herein.

In the step S10, after the light shielding layer 200 is formed on the substrate 100 (S50), the buffer layer 300 is formed on the substrate 100, covering the light shielding layer 200 with reference to FIG. 13b. Other steps, conditions, parameters, etc. are the same or similar as those described above, and they are not repeated herein.

Another embodiment of the present disclosure provides a display substrate. In one embodiment, the display substrate includes the thin film transistor described above. The display substrate can achieve better performance because the thin film transistor can significantly increase the on-state current.

In one embodiment, the shape, configuration, fabrication process, and the like of the display substrate may be the shape, configuration, and fabrication process of the conventional display substrate. Furthermore, those skilled in the art may understand that, in addition to the thin film transistor described above, the display substrate further includes structures and components of the conventional display substrate, and the connection relationship among the structures and the components is also the connection relationship among the structures and components in the conventional display substrate, and details thereof are not repeated herein.

Another embodiment of the present disclosure provides a display apparatus. In one embodiment, the display apparatus includes the display substrate described above. Since the performance of the display substrate is better, the display apparatus can achieve better performance and display effect.

In one embodiment, the shape, configuration, preparation process, and the like of the display apparatus may be the shape, configuration, and fabrication process of the conventional display apparatus. Furthermore, those skilled in the art may understand that, in addition to the display substrate described above, the display apparatus also includes structures and components of the conventional display apparatus, and the connection relationship among the structures and the components is also the connection relationship among the structures and components in the conventional display apparatus, and details thereof are not repeated herein.

The type of display apparatus is not particularly limited, for example, it may include but not limited to mobile phones, tablets, wearable devices, game consoles, etc.

Although the embodiments of the present disclosure have been shown and described, it is understood that the above-described embodiments are illustrative and are not to be construed as limiting the scope of the disclosure. The embodiments are subject to variations, modifications, substitutions and variations.

The principles and the embodiments of the present disclosure are set forth in the specification. The description of the embodiments of the present disclosure is only used to help understand the apparatus and method of the present disclosure and the core idea thereof. Meanwhile, for a person of ordinary skill in the art, the disclosure relates to the scope of the disclosure, and the technical scheme is not limited to the specific combination of the technical features, but also covers other technical schemes which are formed by combining the technical features or the equivalent features of the technical features without departing from the inventive concept. For example, a technical scheme may be obtained by replacing the features described above as disclosed in this disclosure (but not limited to) with similar features.

What is claimed is:

1. A thin film transistor, comprising:
   a substrate;
   a buffer layer on a surface of the substrate;
   an active layer on a surface of the buffer layer opposite from the substrate;
   a gate insulating layer on a surface of the active layer opposite from the substrate, and
   a gate on a surface of the gate insulating layer opposite from the substrate;
   wherein a width of the active layer is smaller than a width of the gate, and an orthographic projection of the gate on the substrate covers an orthographic projection of the active layer on the substrate;
   a conducting layer is provided at two sides of the active layer respectively and an orthographic projection of the conducting layer on the substrate partially overlaps the orthographic projection of the gate on the substrate;
   the buffer layer comprises a first sub-buffer layer on the substrate, and a material forming the first sub-buffer layer contains carriers; and the buffer layer further comprises a second sub-buffer layer on a surface of the first sub-buffer layer opposite from the substrate, the second sub-buffer layer comprising at least a thin region, wherein the orthographic projection of the conducting layer covers an orthographic projection of the thin region on the substrate, and the orthographic projection of the thin region at least has an overlapping area with the orthographic projection of the gate on the substrate; and
   a groove is provided on a surface of the second sub-buffer layer opposite from the first sub-buffer layer, and a part of the second sub-buffer layer under a bottom of the groove constitutes the thin region.

2. The thin film transistor according to claim 1, wherein a thickness of the thin region is less than or equal to about 100 inn.

3. The thin film transistor according to claim 1, wherein a material forming the first sub-buffer layer comprises silicon nitride.

4. The thin film transistor according to claim 1, wherein a material forming the second sub-buffer layer comprises silicon dioxide.

5. The thin film transistor according to claim 1, wherein a material forming the active layer comprises amorphous indium gallium zinc oxide.

6. The thin film transistor according to claim 1, wherein a width of the active layer is within a range of about 1 μm to about 3 μm.

7. The thin film transistor according to claim 1, further comprising:
   a light shielding layer between the substrate and the buffer layer,
   wherein an orthographic projection of the light shielding layer on the substrate covers the orthographic projection of the active layer on the substrate, and an area of the orthographic projection of the light shielding layer on the substrate is smaller than an area of the orthographic projection of the gate on the substrate.

8. A display substrate, comprising the thin film transistor according to claim 1.

9. A display apparatus, comprising the display substrate according to claim 8.

10. A method of fabricating a thin film transistor, comprising:
    providing a substrate;
    forming a buffer layer on a surface of the substrate;
    forming an active layer on a surface of the buffer layer opposite from the substrate; and
    forming a gate insulating layer and a gate sequentially on a surface of the active layer opposite from the substrate,
    wherein a width of the active layer is smaller than a width of the gate, and an orthographic projection of the gate on the substrate covers an orthographic of the active layer on the substrate;
    forming the buffer layer on the surface of the substrate comprises:
      forming a first sub-buffer layer on the surface of the substrate, wherein a material forming the first sub-buffer layer contains carriers; and
      forming a second sub-buffer layer having at least a thin region on a surface of the first sub-buffer opposite from the substrate; and forming the active layer on the surface of the buffer layer opposite from substrate and forming the gate insulating layer and the gate comprise:
 forming a semiconductor layer on a surface of the second sub-buffer layer opposite from the substrate;
 annealing the semiconductor layer to enable the carriers in the first sub-buffer layer to enter the semiconductor layer through the thin region of the second sub-buffer layer;
 forming an insulating layer and a metal layer on surfaces of the second sub-buffer layer and the semiconductor layer opposite from the substrate;
 patterning the metal layer and the insulating layer by one-time patterning process to form the gate and the gate insulating layer respectively; and
 performing a conducting treatment to a part of the semiconductor layer that is not covered by the gate insulating layer and the gate, thereby obtaining the active layer and the conducting layer.

11. The method according to claim 10, Wherein forming the second sub-buffer layer having at least a thin region comprises:
 forming the second sub-buffer layer on a surface of the first sub-buffer opposite from the substrate; and
 forming a groove on a surface of the second sub-buffer layer opposite from the substrate, wherein a part of the second sub-buffer layer under a bottom of the groove constitutes the thin region.

12. The method according to claim 10, wherein forming the second sub-buffer layer having the thin region comprises:
 forming the second sub-buffer layer on a surface of the first sub-buffer opposite from the substrate; and
 forming a groove on a surface of the second sub-buffer layer facing the substrate, wherein a part of the second sub-buffer layer on a top of the groove constitutes the thin region.

13. The method according to claim 10, before forming the buffer layer on the surface of the substrate, further comprising:
 forming a light shielding layer on the surface of the substrate,
 wherein an orthographic projection of the light shielding layer on the substrate covers an orthographic projection of the active layer on the substrate, and an area of the orthographic projection of the light shielding layer on the substrate is less than an area of the orthographic projection of the gate on the substrate.

* * * * *